(12) United States Patent
Nagao et al.

(10) Patent No.: US 8,382,066 B2
(45) Date of Patent: Feb. 26, 2013

(54) GATE VALVE

(75) Inventors: Takashi Nagao, Tsukubamirai (JP);
Hiroshi Ogawa, Tsukubamirai (JP);
Hiromi Shimoda, Tsukubamirai (JP)

(73) Assignee: SMC Corporation, Tokyo (JP)

( * ) Notice: Subject to any disclaimer, the term of this patent is extended or adjusted under 35 U.S.C. 154(b) by 343 days.

(21) Appl. No.: 12/887,096

(22) Filed: Sep. 21, 2010

(65) Prior Publication Data
US 2011/0089354 A1    Apr. 21, 2011

(30) Foreign Application Priority Data
Oct. 15, 2009  (JP) ................................. 2009-238479

(51) Int. Cl.
*F16K 3/16*  (2006.01)
(52) U.S. Cl. .......................... 251/204; 251/243; 251/284
(58) Field of Classification Search ................. 251/193, 251/203–204, 242–243, 284
See application file for complete search history.

(56) References Cited

U.S. PATENT DOCUMENTS

| | | | |
|---|---|---|---|
| 5,626,324 A * | 5/1997 | Nakamura et al. | 251/204 |
| 5,641,149 A * | 6/1997 | Ito | 251/158 |
| 6,082,706 A * | 7/2000 | Irie | 251/203 |
| 6,390,449 B1 | 5/2002 | Ishigaki et al. | |
| 6,736,368 B2 * | 5/2004 | Osawa et al. | 251/203 |
| 7,066,443 B2 * | 6/2006 | Ishigaki | 251/203 |
| 7,198,251 B2 * | 4/2007 | Kondoh | 251/193 |

FOREIGN PATENT DOCUMENTS

| | | |
|---|---|---|
| JP | 2000-356271 | 12/2000 |
| JP | 3586657 | 8/2004 |
| JP | 2005-291221 | 10/2005 |

OTHER PUBLICATIONS

U.S. Appl. No. 13/445,006, filed Apr. 12, 2012, Shimoda, et al.

* cited by examiner

*Primary Examiner* — John Bastianelli
(74) *Attorney, Agent, or Firm* — Oblon, Spivak, McClelland, Maier & Neustadt, L.L.P.

(57) ABSTRACT

Between a driving base operated by an air cylinder and a lever member fixed to a valve shaft integral with a valve plate, a connecting mechanism for connecting the driving base and a lever member, capable of displacement, and a cam mechanism for tilting the lever member are interposed, and a stopper mechanism for stopping the lever member at an opposing position of the valve plate or a full-open position, and after the lever member is stopped by the stopper mechanism at the opposing position or the full-open position, the lever member is tilted by the cam mechanism so as to incline the valve plate and to press a valve seal to a valve seat portion or a wall face in the periphery of an opening.

12 Claims, 12 Drawing Sheets

GATE VALVE

BACKGROUND OF THE INVENTION

[1] Field of the Invention

The present invention relates to a gate valve mounted on a vacuum chamber in a semiconductor processing apparatus and used for opening/closing of an opening communicating with the vacuum chamber.

[2] Description of the Related Art

As described in a patent document, Japanese Unexamined Patent Application Publication No. 2000-356271, and a patent document, Japanese Unexamined Patent Application Publication No. 2005-291221, in a semiconductor processing apparatus, a gate valve is used for opening/closing of an opening communicating with a vacuum chamber. This gate valve has a valve plate opening/closing the opening, and if the opening is to be closed by this valve plate, the valve plate is moved by an air cylinder to an opposite position opposing the opening and then, the valve plate is inclined so as to press a valve seal to a valve seat portion in the periphery of the opening, while if the opening is to be fully opened, the valve seal is separated from the valve seat portion and then, the valve plate is moved by the air cylinder to a full-open position not opposing the opening and made to standby at the position.

However, when the valve plate stands by at the full-open position, the valve plate is opposed to a wall in which the opening is formed, but since there is a gap between the valve plate and the wall face, a corrosive fluid such as process gas flows into this gap, and the surface of the valve plate or particularly the valve seal is subjected to damage by plasma attack, adhesion of a deposit and the like. Thus, cleaning of the valve plate, replacement of the valve seal and the like had to be performed frequently.

On the other hand, a patent document, Japanese Patent No. 3586657, discloses a gate valve that can solve such a problem. This gate valve is configured such that when the valve plate is moved to a full-open position not opposing the opening, the valve plate is inclined so as to press the valve seal to the wall face and to bring it into a sealed state. As a result, since areas of the valve plate and the valve seal in contact with the corrosive fluid are made small, damage on the valve plate and the valve seal by plasma attack, adhesion of a deposit and the like can be reduced.

However, since in the gate valve described in Patent Document 3, an operation to move the valve plate to a closed position and the full-open position of the opening and an operation to incline the valve plate at the closed position and the full-open position and to press the valve seal to the valve seat portion and the wall face are performed by combining a plurality of (three) air cylinders, it has a problem that a structure and a control system become complicated.

BRIEF SUMMARY OF THE INVENTION

The present invention has an object to provide a gate valve whose structure is simple and control system for an air cylinder is also simple and capable of performing an operation to move a valve plate to a closed position and a full-open position and an operation to press the valve plate at the closed position and the full-open position and to press a valve seal to a valve seat portion and a wall face in the periphery of an opening by using a single air cylinder.

In order to achieve the above object, according to the present invention, a gate valve is provided, having a valve plate for opening/closing an opening communicating with a vacuum chamber, a valve seal provided in the valve plate, a valve shaft connected to the valve plate, an air cylinder for performing an opening/closing operation of the valve plate, and an operating mechanism interposed between the air cylinder and the valve shaft, in which by operating the valve shaft by the air cylinder through the operating mechanism, the valve plate is moved to an opposing position opposing the opening, a closed seal position closing the opening by pressing the valve seal to the valve seat portion in the periphery of the opening, a full-open position not opposing the opening, and an open seal position where the valve seal is pressed to a wall face of a wall in which the opening is formed at the full-open position.

The operating mechanism has a driving base mounted on a piston rod of the air cylinder, a lever member mounted on the valve shaft, a connecting mechanism for connecting the lever member and the driving base to each other, capable of relative displacement, a cam mechanism for tilting the lever member, and a stopper mechanism for stopping the lever member at the opposing position or the full-open position.

The cam mechanism is formed by a cam groove formed in the driving base and a cam follower mounted on the lever member, and the cam follower can move in the cam groove from an intermediate engagement position to be engaged with the center in the cam groove to a first engagement position at one end of the cam groove or a second engagement position at the other end by relative displacement between the driving base and the lever member, and the lever member, the valve shaft, and the valve plate are integrally tilted by the movement.

Also, the connecting mechanism has a connecting table, a lever spring interposed between the connecting table and the lever member, and a guide spring interposed between the connecting table and the driving base, and when the cam follower is located at the intermediate engagement position, the driving base and the lever member are brought into an integral state, while when the cam follower is moving from the intermediate engagement position to the first engagement position or the second engagement position in the cam groove, the driving base and the lever member are relatively displaced by deformation of the lever spring or the guide spring so that the lever member can be tilted.

Moreover, the stopper mechanism has a first contact member and a second contact member provided on the lever member and a first stopper and a second stopper in a fixed relationship with the air cylinder and is configured such that the lever member is stopped at the opposing position by contact between one of the contact members and one of the stoppers, while the lever member is stopped at the full-open position by contact between the other contact member and the other stopper.

In the present invention, a table receiver and a base-spring receiver are formed on the driving base at an interval in a moving direction of the driving base, and a lever-spring receiver is also formed on the lever member so as to occupy a position opposite the table receiver through the base-spring receiver, the connecting table is disposed between the table receiver and the base-spring receiver, capable of displacement, the lever spring is interposed between the connecting table and the lever-spring receiver, and the guide spring is interposed between the connecting table and the base-spring receiver.

In the present invention, two parallel guide shafts are preferably mounted on the table receiver and the base-spring receiver, penetrating the connecting table, for guiding the connecting table, and two pieces of the coil-shaped guide springs are provided so as to surround each of the guide shafts.

Also, in the present invention, it is preferable that when the cam follower moves in the cam groove from the intermediate engagement position to the first engagement position, the connecting table is locked by the driving base and the lever spring is deformed, while when the cam follower moves in the cam groove from the intermediate engagement position to the second engagement position, the connecting table is locked by the lever member and the guide spring is deformed.

In a preferred embodiment of the present invention, two valve shafts connected to both ends of the valve plate and two pairs of operating mechanisms corresponding to each of the valve shafts are disposed symmetrically through the air cylinder on both right and left sides of the air cylinder.

The gate valve of the present invention is provided with the connecting mechanism and the cam mechanism using the spring interposed between the driving base operated by the air cylinder and the lever member mounted on the valve shaft and the stopper mechanism for stopping the lever member at the opposing position of the valve plate or the full-open position, and an operation to move the valve plate to the opposing position and the full-open position and an operation to tilt the valve plate at the opposing position and the full-open position so as to bring the valve seal into contact with the valve seat portion and the wall face in the periphery of the opening can be performed by using the single air cylinder, and as a result, a structure of the gate valve and a control system of the air cylinder can be simplified.

DETAILED DESCRIPTION OF THE INVENTION

Figure 1:
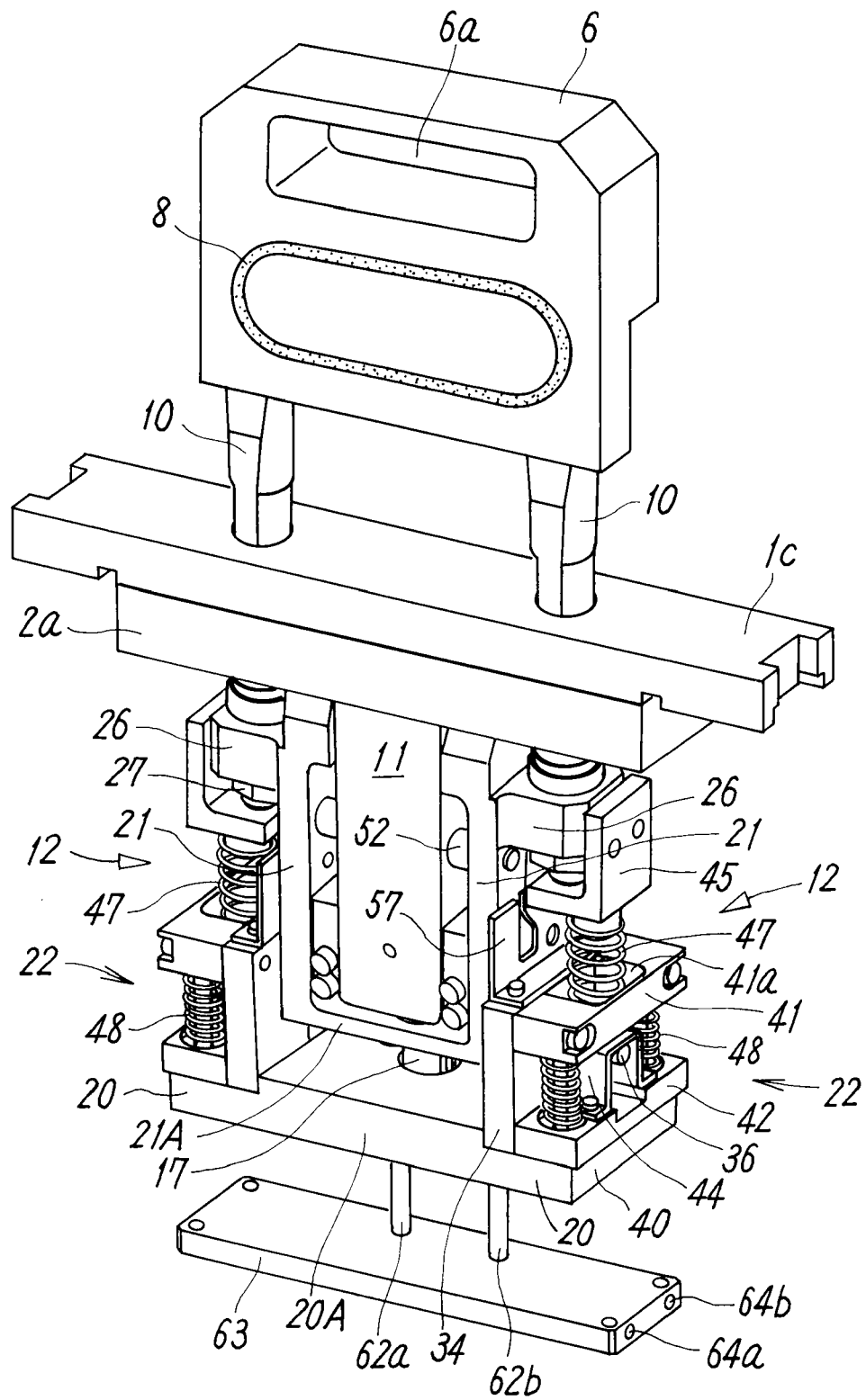
FIG. 1 is a perspective view of an embodiment of the present invention in an intermediate operated state with an illustration of a valve casing and an operating portion housing omitted.

Figures show an embodiment of a gate valve according to the present invention. This gate valve opens/closes an opening 4 connected to a vacuum chamber 70 (See FIG. 3) of a semiconductor processing apparatus and communicating with the vacuum chamber 70, and the opening 4 is opened/closed for discharging air in the vacuum chamber 70 or taking-out and putting-in of a semiconductor wafer with respect to the vacuum chamber 70. This gate valve has, as shown in FIGS. 1 to 4, a valve casing 1 connected to the vacuum chamber 70 and an operating portion housing 2 connected to a lower part of the valve casing 1.

The valve casing 1 is in a square box shape, in which a laterally long rectangular opening 4 communicating with the vacuum chamber 70 and an opening 5 are formed in opposing front and rear walls 1a and 1b, and a laterally long rectangular valve plate 6 for opening/closing the opening 4 in the front wall 1a is contained inside the valve casing 1. In an inner face of the front wall 1a, a rectangular or oval shaped valve seat portion 7 is formed so as to surround the opening 4, and on a front face of the valve plate 6, a rectangular or oval valve seal 8 to be brought into contact with the valve seat portion 7 so as to close the opening 4 is attached.

Also, at an upper end portion of the valve plate 6, a communication hole 6a is formed, and if the valve plate 6 stands by at a position to fully open the opening 4, the opening 4 and the opening 5 communicate with each other without trouble through this communication hole 6a. However, this communication hole 6a is not necessarily needed, and the upper end portion in which this communication hole 6a of the valve plate 6 is formed does not have to be provided.

To right and left both end portions of the valve plate 6, upper ends of two valve shafts 10 are connected, while the lower end portions of the valve shafts 10 penetrate a bottom wall 1c of the valve casing 1 and a bonnet plate 2a at an upper end of the operating portion housing 2, capable of tilting and extend to the inside of the operating portion housing 2.

Inside the operating portion housing 2, a single air cylinder 11 and two pairs of operating mechanisms 12 interposed between the air cylinder 11 and the two valve shafts 10 are disposed, and it is configured such that by operating the two valve shafts 10 through the two pairs of operating mechanisms 12 by the single air cylinder 11, the valve plate 6 occupies an opposing position (FIGS. 5 and 6) opposing the opening 4, a closed seal position (FIGS. 7 and 8) closing the opening 4 by pressing the valve seal 8 to the valve seal portion 7, a full-open position (FIGS. 9 and 10), which is a position not opposing the opening 4, and an open seal position (FIGS. 11 and 12) where the valve seal 8 is pressed onto the wall face 9 of the wall 1a on the front of the valve casing 1 at the full-open position.

Figure 3:
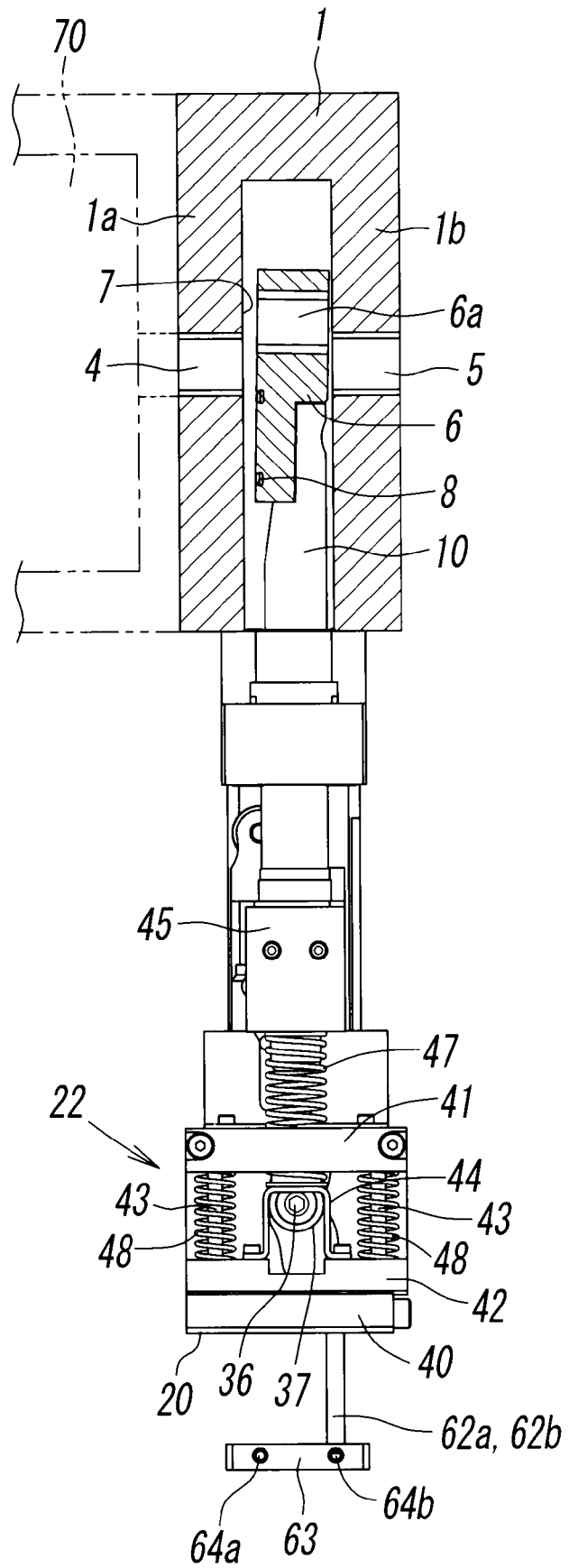
FIG. 3 is a right side view of FIG. 2.
Figure 4:
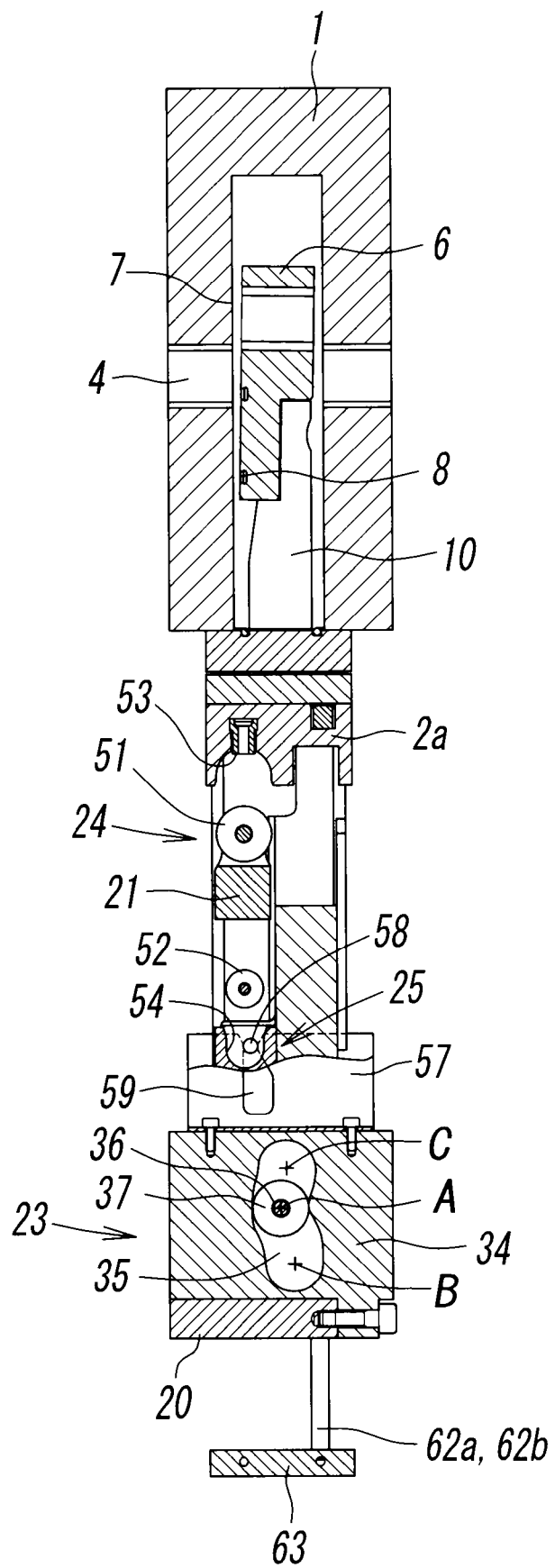
FIG. 4 is a sectional view along IV-IV line in FIG. 2.
Figure 5:
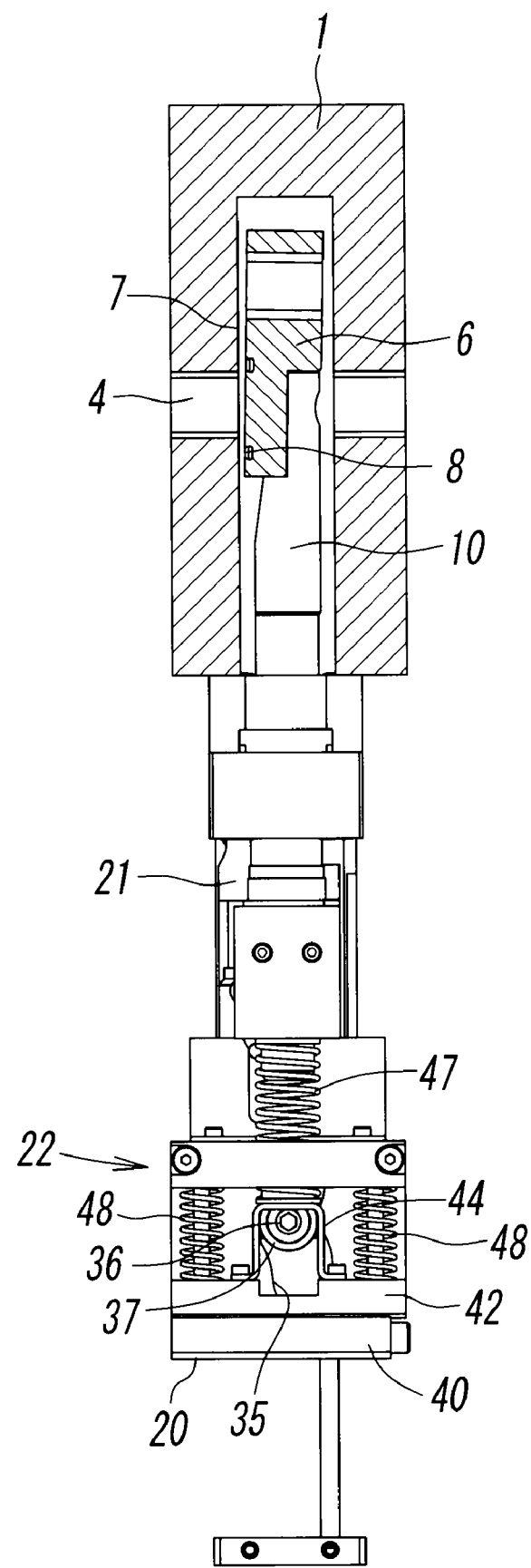
FIG. 5 is a right side view in an operated state in which a valve plate is at an opposing position.
Figure 6:
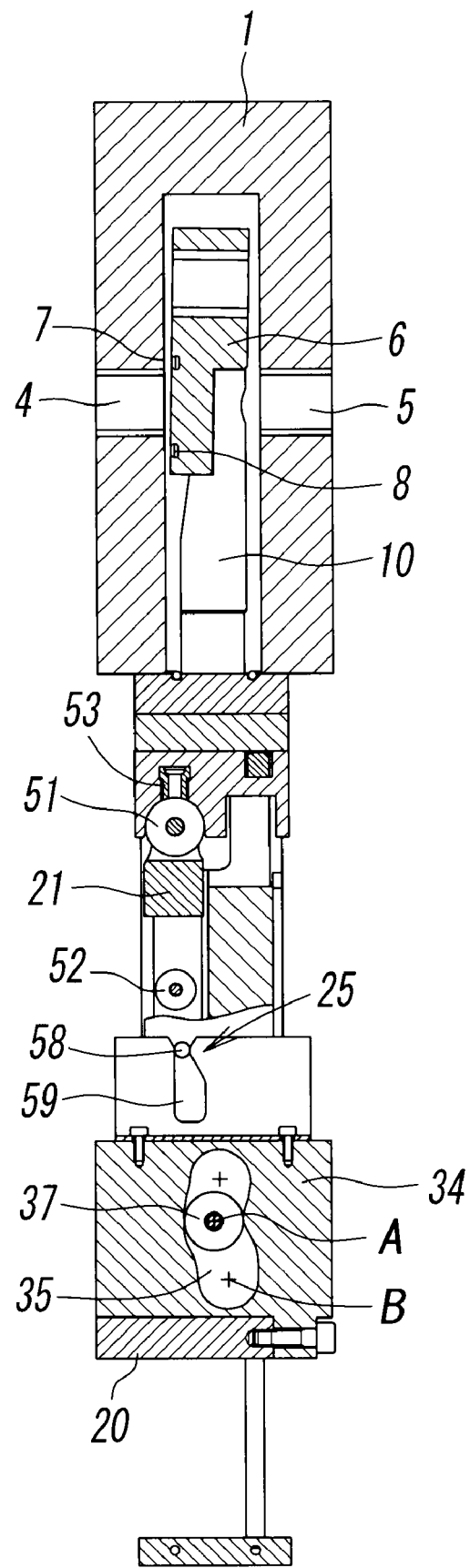
FIG. 6 is a sectional view in the same operated state as in FIG. 5 at a position similar to FIG. 4.
Figure 7:
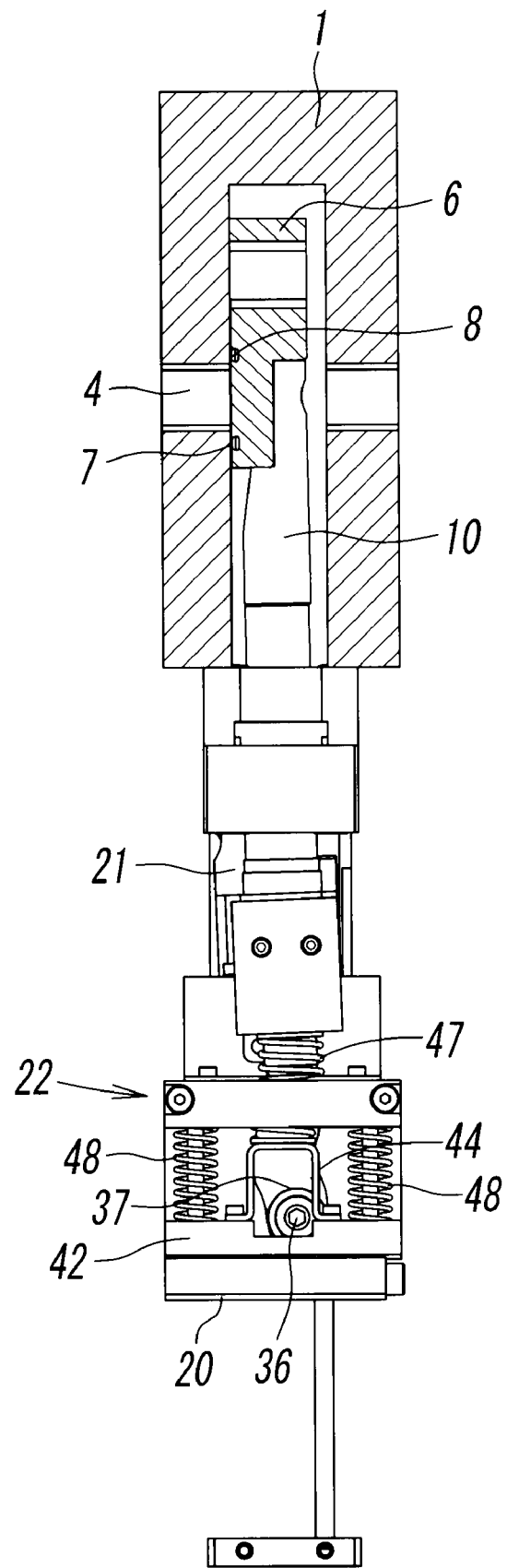
FIG. 7 is a right side view in an operated state in which the valve plate is at a closed seal position.
Figure 8:
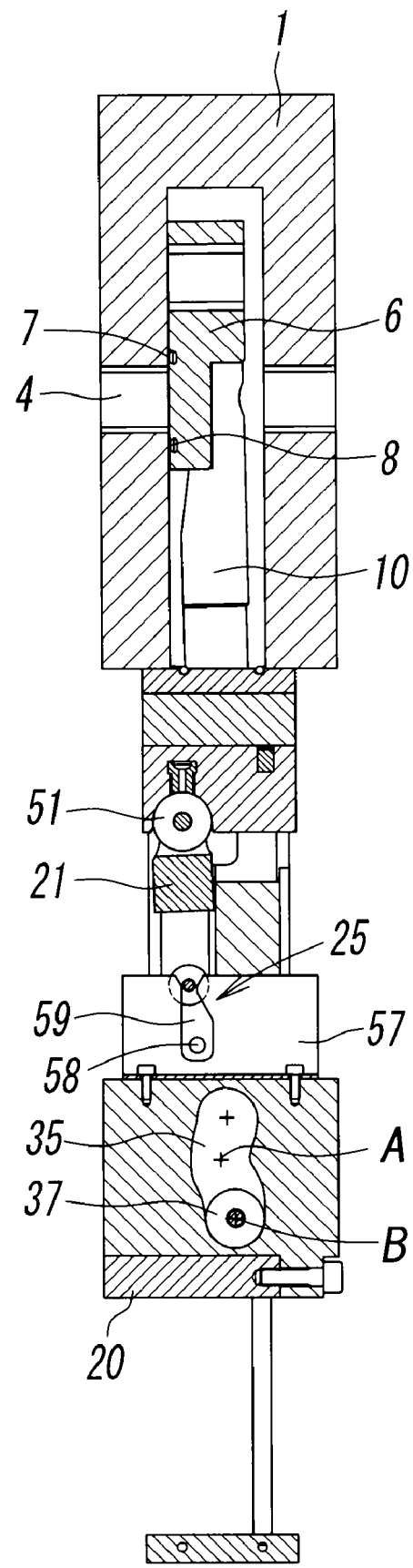
FIG. 8 is a sectional view in the same operated state as in FIG. 7 at a position similar to FIG. 4.
Figure 9:
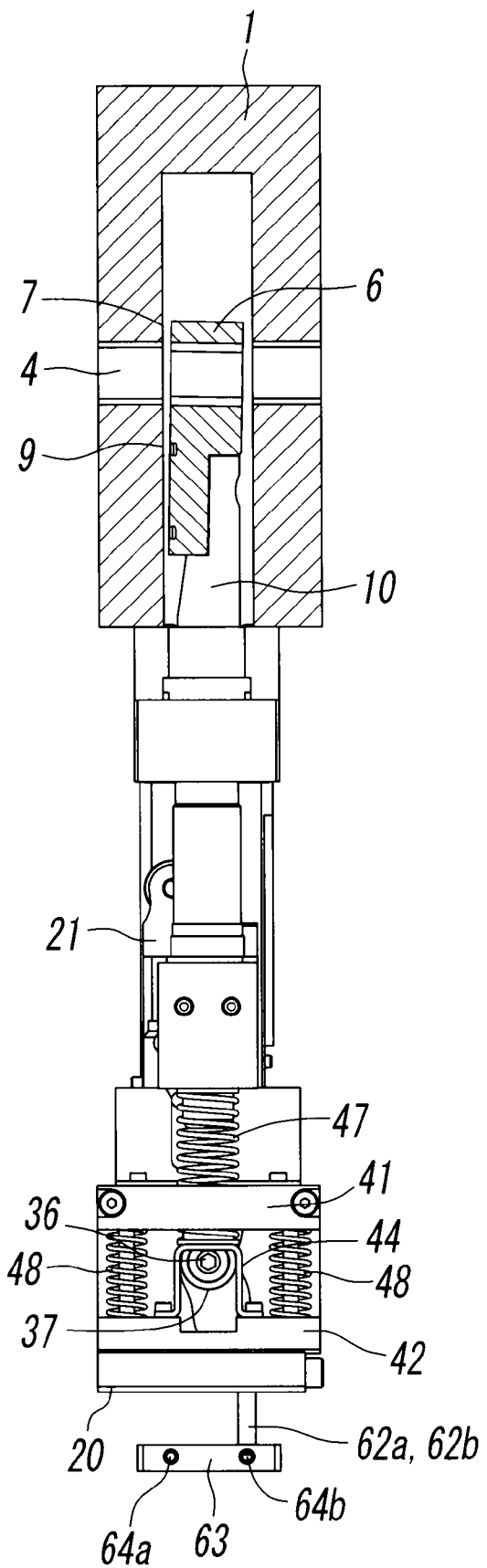
FIG. 9 is a right side view in an operated state in which the valve plate is at a full-open position.
Figure 10:
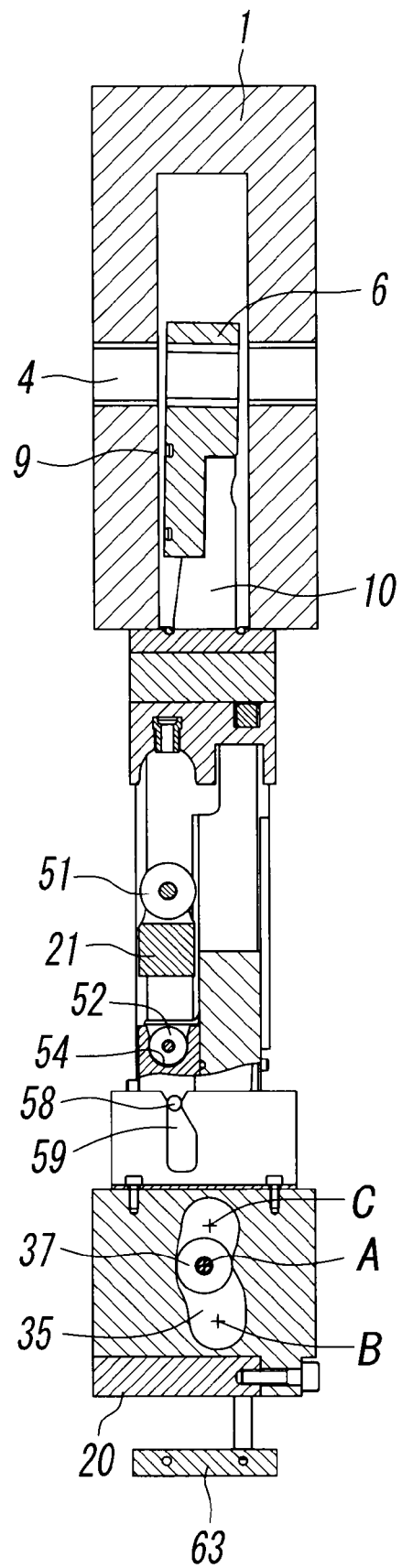
FIG. 10 is a sectional view in the same operated state as in FIG. 9 at a position similar to FIG. 4.
Figure 11:
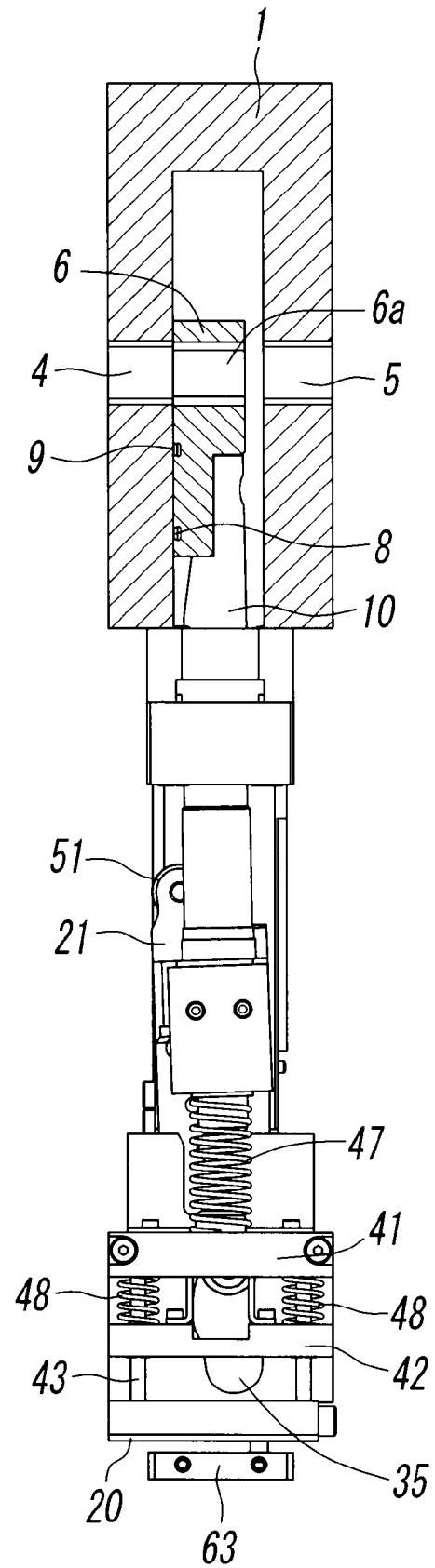
FIG. 11 is a right side view in an operated state in which the valve plate is at an open seal position.
Figure 12:
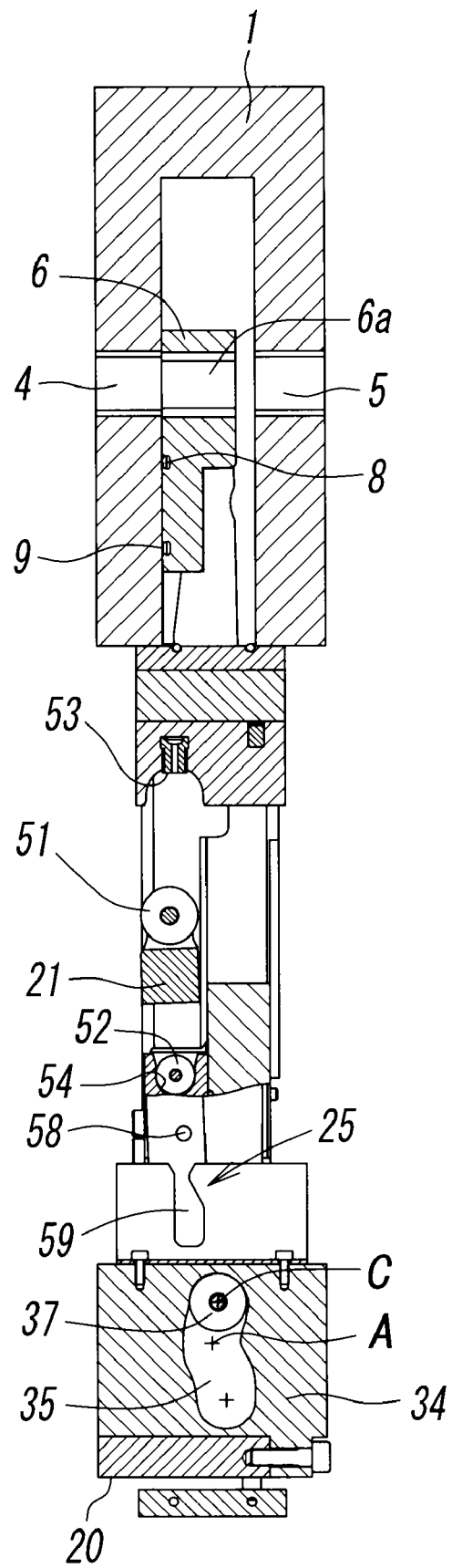
FIG. 12 is a sectional view in the same operated state as in FIG. 11 at a position similar to FIG. 4.

In an actual operation of the gate valve, in order to close the opening 4 by the valve plate 6, the valve plate 6 moves from the open seal position in FIGS. 11 and 12 to the full-open position in FIGS. 9 and 10, the opposing position in FIGS. 5 and 6, and the closed seal position in FIGS. 7 and 8 in order, while in order to open the opening 4, the operation proceeds in the order opposite the above, but for convenience of description, a configuration of the gate valve will be described when the valve plate 6 is located at an intermediate operation position as shown in FIGS. 1 to 4.

The air cylinder 11 has a prismatic cylinder body 15, a piston 16 inside the cylinder body 15, and a piston rod 17 connected to the piston 16, and the piston rod 17 is perpendicularly fixed to a lower face of the bonnet plate 2a with an attitude expanding/contracting downward, and the two valve shafts 10 and the two pairs of operating mechanisms 12 are symmetrically disposed at positions on both right and left sides of the air cylinder 11 through the air cylinder 11. Therefore, a central axis L of the air cylinder 11 and a central axis of the gate valve match each other.

The operating mechanism 12 has a driving base 20 connected to the piston rod 17 of the air cylinder 11 and moving together with the piston rod 17, a lever member 21 fixed to the valve shaft 10 and moving together with the valve shaft 10, a connecting mechanism 22 connecting the lever member 21 and the driving base 20, capable of relative displacement, a cam mechanism 23 for tilting the lever member 21, and a stopper mechanism 24 for stopping the lever member 21 at the opposing position of the valve plate 6 or the full-open position.

The driving base 20 is constructed by a single plate-shaped member 20A with the center part connected to the piston rod 17 and evenly extending to the right and left, and a right half part of this member 20A forms the driving base 20 of the right-side operating mechanism 12, while a left half part forms the driving base 20 of the left-side operating mechanism 12.

Also, the lever member 21 is formed by a U-shaped member 21A, and this member 21A is disposed between the driving base 20 and the bonnet plate 2a so as to displace along a side face of the cylinder body 15 in a state in which the piston rod 17 freely penetrates through a hole at the center of a horizontal bottom plate of the member. The right half part of the member 21A forms the lever member 21 of the right-side operating mechanism 12, while the left half part forms the lever member 21 of the left-side operating mechanism 12. The lever member 21 has a shaft mounting portion 26 on its side face and is fixed by a nut 27 to the lower end of the valve shaft 10 at a position of the shaft mounting portion 26.

To a cylindrical support member 29 mounted on the bonnet plate 2a and an annular support member 30 mounted on the valve shaft 10, both ends of a telescopic bellows 31 are connected so as to surround a part of the valve shaft 10, and the inside of the valve casing 1 and the inside of the operating portion housing 2 are shut off from each other by this bellows 31 so that process gas in the valve casing 1 does not flow into the operating portion housing 2.

In order to form the cam mechanism, a cam plate 34 extending in the central axis L direction (moving direction of the driving base 20) along an outer face of the lever member 21, is fixed to the driving base 20 at a position slightly closer from the end portion to the inside, that is, to the central axis L side, and a cam groove 35 bent at the center in a dogleg shape is formed in the cam plate 34.

In the meantime, to an outer side face of a lower end portion in the lever member 21, a cam shaft 36 penetrating the cam groove 35 and horizontally extending to the vicinity of the end portion of the driving base 20 is fixed, and at an intermediate position of this cam shaft 36, a cam follower 37 constituted by a roller is rotatably mounted, and the cam follower 37 is engaged in the cam groove 35. This cam follower 37 is located at an intermediate engagement position A engaged with the center of the cam groove 35 if the driving base 20 and the lever member 21 maintain a predetermined positional relationship and they do not relatively displace (integral state), and if the driving base 20 and the lever member 21 are relatively displaced, the cam follower 37 can move from the intermediate engagement position A to a first engagement position B on one end of the cam groove 35 or a second engagement position C on the other end. By means of movement of the cam follower 37, the lever member 21, the valve shaft 10, and the valve plate 6 are integrally tilted along inclination of the cam groove 35 so that the valve plate 6 occupies the closed seal position (FIG. 8) or the open seal position (FIG. 12).

Also, in order to constitute the connecting mechanism 22, a table receiver 40 is formed at an end portion of the driving base 20, a plate-shaped base-spring receiver 41 is fixed to an outer side face of an upper end portion of the cam plate 34 in parallel with the table receiver 40, and a plate-shaped connecting table 42 is disposed capable of displacement along two parallel guide shafts 43 between the table receiver 40 and the base-spring receiver 41. The guide shafts 43 are disposed in parallel with the central axis L, having upper and lower ends fixed to the table receiver 40 and the base-spring receiver 41 and penetrate the connecting table 42. On an upper face of the connecting table 42, a laid-groove shaped locking member 44 is fixed, and an end portion of the cam shaft 36 advances into the laid groove of the locking member 44.

On the other hand, a lever-spring receiver 45 is formed on the shaft mounting portion 26 of the lever member 21, and this lever-spring receiver 45 occupies a position opposite the table receiver 40 through the base-spring receiver 41. Between the lever-spring receiver 45 and the locking member 44 of the connecting table 40, a coil-shaped lever spring 47 is interposed in a compressed state penetrating a hole 41a formed in the base-spring receiver 41, and between the connecting table 42 and the base-spring receiver 41, two coil-shaped guide springs 48 are interposed in the compressed state so as to surround the guide shaft 43.

The connecting table 42 is usually pressed to the table receiver 40 of the driving base 20 by means of an urging force of the lever spring 47 and the guide spring 48, by which the driving base 20 and the lever member 21 maintain an integral state not relatively displaced but keeping a predetermined positional relationship with each other. At this time, the cam follower 37 occupies the intermediate engagement position A at the center of the cam groove 35. Also, the locking member 44 of the connecting table 42 is in contact with the cam shaft 36 from above but not yet to be lifted by the cam shaft 36 so as to float the connecting table 42 from the table receiver 40.

Then, the driving base 20 and the lever member 21 is moved by the air cylinder 11 to the opposing position or full-open position while maintaining the integral state, and after the lever member 21 is stopped by the stopper mechanism 24 at the position, if the driving base 20 is further moved, the cam groove 35 is displaced with respect to the cam follower 37, and the cam follower 37 is relatively moved to the first engagement position B or the second engagement position C. In this case, if the cam follower 37 is moved from the intermediate engagement position A to the first engagement position B at the lower end of the cam groove 35 by means of upward movement of the driving base 20 (cam groove 35), the connecting table 42 is integrally moved with the driving base 20 while being locked by the driving base 20, and the lever spring 37 is compressed. Also, if the cam follower 37 is moved from the intermediate engagement position A to the second engagement position C at the upper end of the cam groove 35 by means of downward movement of the driving base 20 (cam groove 35), the locking member 44 of the connecting table 42 is locked by the cam shaft 36 and the connecting table 42 is locked by the lever member 21, and the connecting table 42 is also stopped at the position, and the guide spring 48 is compressed.

The stopper mechanism 24 is formed by a first contact member 51 and a second contact member 52 disposed on the lever member 21 at an interval in the moving direction of the lever member 21 and a first stopper 53 and a second stopper 54 disposed so as to form a fixed relationship with the cylinder body 15 of the air cylinder 11.

The first contact member 51 and the second contact member 52 are formed by rollers, and the first contact member 51 is disposed on an upper part side of the lever member 21, while the second contact member 52 is disposed on a lower part side of the lever member 21.

On the other hand, the first stopper 53 and the second stopper 54 form recess shapes in which the rollers can be fitted, and the first stopper 53 is disposed on a lower face of the bonnet plate 2a, while the second stopper 54 is formed on a side face of the cylinder body 15.

A position where the first contact member 51 is brought into contact with the first stopper 53 is the opposing position of the valve plate 6, a position where the second contact member 52 is brought into contact with the second stopper 54 is the full-open position of the valve plate 6, and the lever member 21 stops movement at these positions.

An attitude control mechanism 25 is disposed on the driving base 20 and the lever member 21 to prevent the lever member 21 from tilting if the driving base 20 and the lever member 21 are in the integral state. This attitude control mechanism 25 is formed by a groove plate 57 fixed to an upper end of the cam plate 34 and a locking pin 58 mounted on a side face of the lever member 21.

In the groove plate 57, a locking groove 59 is cut out downward from the upper end, and a groove width of the locking groove 59 is partially small in the upper end portion but large in the other portions.

The locking pin 58 is engaged with a portion with the small groove width at the upper end of the locking groove 59 if the driving base 20 and the lever member 21 are in the integral state, by which tilting of the lever member 21 is prevented, and if the driving base 20 and the lever member 21 are relatively displaced, the pin is moved to a portion with the large groove width in the locking groove 59 or removed from the locking groove 59 so as to allow tilting of the lever member 21. That is, if the driving base 20 moves upward toward the closed seal position, the locking pin 58 moves to the portion with the large groove width in the locking groove 59, while if the driving base 20 moves downward toward the open seal position, the locking pin 58 occupies a position removed upward from the locking groove 59.

Also, in order to supply/discharge compressed air to/from first and second two pressure chambers 61a, 61b located on both sides of the piston 16 in the air cylinder 11, first and second two ducts 62a, 62b individually communicating with each of the pressure chambers 61a, 61b extend downward from the cylinder body 15, and a port plate 63 is mounted at the lower ends of the ducts 62a, 62b. This port plate 63 also acts as the bottom plate of the operating portion housing 2 and has first and second two ports 64a, 64b on the side face and two flow passages communicating with the ports 64a, 64b inside, and the flow passages individually communicate with the ducts 62a, 62b. By alternately supplying/discharging the compressed air to/from the two ports 64a, 64b, the piston 16 is vertically driven so as to operate the valve plate 6.

Figure 2:
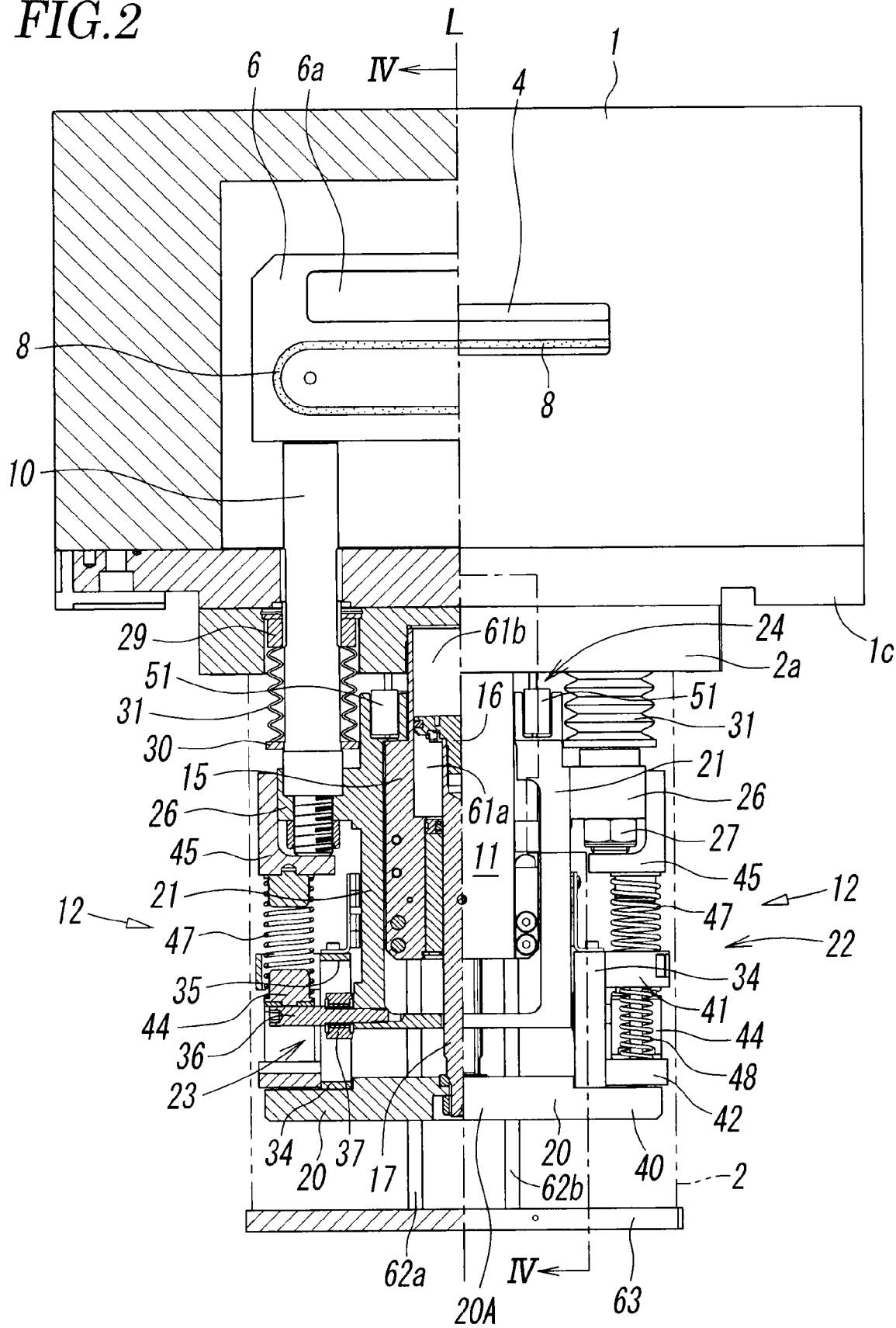
FIG. 2 is a partially broken front view of FIG. 1.

In the gate valve having the above configuration, FIGS. 2 to 4 illustrate an intermediate operation state in which the compressed air is supplied from the first port 64a to the first pressure chamber 61a of the air cylinder 11 through the first duct 62a, and the air in the second pressure chamber 61b is discharged to the outside from the second duct 62b through the second port 64b so that the piston rod 17 is raised and the valve plate 6 is moving from the open seal position in FIG. 12 to the closed seal position in FIG. 8. At this time, the driving base 20 and the lever member 21 maintain the integral state by the connecting mechanism 22, the cam follower 37 of the cam mechanism 23 is located at the intermediate engagement position A, the first contact member 51 as well as the second contact member 52 and the first stopper 53 as well as the second stopper 54 of the stopper mechanism 24 are in a non-contact state with each other, and the locking pin 58 of the attitude control mechanism 25 is engaged with the portion with the small groove width at the upper end of the locking groove 59 and prevents tilting of the lever member 21.

If the piston rod 17 of the air cylinder 11 is raised by further supply of the compressed air to the first pressure chamber 61a from the state in FIGS. 2 to 4, as shown in FIGS. 5 and 6, the first contact member 51 at the upper end of the lever member 21 is brought into contact with the first stopper 53, and the lever member 21 is stopped at the position. Thus, the valve shaft 10 and the valve plate 6 fixed to the lever member 21 are also stopped, and the valve plate 6 occupies the opposing position opposing the opening 4.

However, since the driving base 20 continues to be raised by the piston rod 17 even after the lever member 21 is stopped, as shown in FIGS. 7 and 8, the lever spring 47 is compressed through the connecting table 42 locked by the driving base 20, and the cam groove 35 of the driving base 20 is displaced upward with respect to the cam follower 37 of the lever member 21. By this displacement of the cam groove 35, the cam follower 37 is relatively moved from the intermediate engagement position A to the first engagement position B at the lower end of the cam groove 35, and by means of the movement of the cam follower 37, the lever member 21, the valve shaft 10, and the valve plate 6 are integrally tilted along the inclination of the cam groove 35, and the valve seal 8 of the valve plate 6 is pressed onto the valve seat portion 7 so that the valve plate 6 occupies the closed seal position.

Also, in the attitude control mechanism 25, since the locking groove 59 is displaced upward together with the driving base 20, the locking pin 58 of the lever member 21 is moved downward in the locking groove 59 to the portion with the large groove width and allows tilting of the lever member 21.

Subsequently, if the opening 4 is to be opened from the closed seal position in FIGS. 7 and 8, the compressed air is supplied into the second pressure chamber 61b of the air cylinder 11 from the second port 64b through the second duct 62b, and the air in the first pressure chamber 61a is discharged to the outside from the first duct 62a through the first port 64a. As a result, first, as shown in FIGS. 5 and 6, by means of a lowering force of the piston rod 17 and an elastic recovering force of the compressed lever spring 47, the driving base 20 is lowered, and since the cam groove 35 is also lowered, the cam follower 37 is moved in the cam groove 35 from the first engagement position B to the intermediate engagement position A, and with that movement, inclination of the lever member 21, the valve shaft 10, and the valve plate 6 are released, the valve seal 8 leaves the valve seat portion 7 and the valve plate 6 occupies the opposing position. Also, the driving base 20 and the lever member 21 are brought into the integral state by the connecting mechanism 22, and the locking pin 58 is engaged with the portion with the small groove width at the upper end of the locking groove 59.

Then, if the piston rod 17 continues to be lowered from that state, through the operation state shown in FIGS. 3 and 4, as shown in FIGS. 9 and 10, the second contact member 52 at the lower part of the lever member 21 is brought into contact with the second stopper 54, and the lever member 21 is stopped at this position. Thus, the valve shaft 10 and the valve plate 6 are also stopped with the lever member 21, and the valve plate 6 occupies the full-open position not opposing the opening 4 at a position separated from the opening 4. Also, since the locking member 44 on the connecting table 42 is locked by the cam shaft 36 from above, lowering of the connecting table 42 is also stopped at the position.

However, since the driving base 20 continues to be lowered by the piston rod 17, as shown in FIGS. 11 and 12, the guide spring 48 between the base-spring receiver 41 and connecting table 42 of the driving base 20 is compressed, and the cam groove 35 of the driving base 20 is displaced downward with respect to the cam follower 37 of the lever member 21. By means of this displacement of the cam groove 35, the cam follower 37 is relatively moved from the intermediate engagement position A to the second engagement position C at the upper end of the cam groove 35, and the lever member 21, the valve shaft 10, and the valve plate 6 are integrally tilted along the inclination of the cam groove 35 by means of the movement of the cam follower 37. Then, the valve seal 8 of the valve plate 6 is pressed onto the inner wall face 9 of the wall 1a of the valve casing 1, and the valve plate 6 occupies the open seal position.

Also, in the attitude control mechanism 25, since the locking groove 59 is displaced downward with the driving base 20, the locking pin 58 of the lever member 21 is removed from the locking groove 59 to the outside and allows tilting of the lever member 21.

If the opening 4 is to be closed from the open seal position in FIGS. 11 and 12, the supply/discharge relation of the compressed air with respect to the first and second pressure chambers 61a, 61b of the air cylinder 11 is reversed. As a result, first, by means of a rising force of the piston rod 17 and the elastic recovering force of the compressed guide spring 48, the driving base 20 is raised, and since the cam groove 35 is also raised together with that, the cam follower 37 is moved from the second engagement position C to the intermediate engagement position A in the cam groove 35, and with that movement, the inclination of the lever member 21, the valve shaft 10, and the valve plate 6 is released, the valve seal 8 is separated from the wall face 9 of the wall 1a, and the valve plate 6 occupies the full-open position as in FIGS. 9 and 10. Also, since the connecting base is brought into contact with the table receiver 40 of the driving base 20, the driving base 20 and the lever member 21 are brought into the integral state, and the locking pin 58 is engaged with the portion with the small groove width at the upper end of the locking groove 59.

Then, since the piston rod 17 continues to be raised from the above-mentioned state, the operating mechanism 12 operates so that the valve plate 6 moves to the closed seal position through the operation state in FIGS. 3 and 4.

As mentioned above, according to this embodiment, by interposing the connecting mechanism 22 constituted by the springs 47, 48 and the connecting table 42 and the cam mechanism 23 between the driving base 20 operated by the air cylinder 11 and the lever member 21 mounted on the valve shaft 10 and by providing the stopper mechanism 24 for stopping the lever member 21 at the opposing position of the valve plate 6 or the full-open position, an operation to move the valve plate 6 from the open seal position to the closed seal position or to move it in the opposite direction can be performed using the single air cylinder 11. Therefore, as compared with the prior-art products using a plurality of air cylinders, the configuration of the gate valve is simpler and the control system of the air cylinder can be also simplified.

In this embodiment, the gate valve has the valve casing 1, and the valve plate 6 is contained in this valve casing 1, but this kind of valve casing 1 is not necessarily required but it may be so configured that only a wall corresponding to the front wall 1a of the valve casing 1 is left, while the rear wall 1b, right and left walls and an upper wall of the valve casing 1 are eliminated. The gate valve configured as above can be suitably used for opening/closing the opening through which a semiconductor wafer is taken out/placed in a vacuum chamber. The point that the portion in which the communication hole 6a is formed at the upper end portion of the valve plate 6 may be omitted as necessary is the same as the above-mentioned embodiment.

The invention claimed is:
1. A gate valve comprising:
a valve plate for opening/closing an opening communicating with a vacuum chamber;
a valve seal provided in the valve plate;
a valve shaft connected to the valve plate;
an air cylinder for opening and closing the valve plate; and
an operating mechanism interposed between the air cylinder and the valve shaft, in which by operating the valve shaft with the air cylinder through the operating mechanism, the valve plate is moved to an opposing position opposing the opening, a closed seal position closing the opening by pressing the valve seal to the valve seat portion in the periphery of the opening, a full-open position not opposing the opening, and an open seal position where the valve seal is pressed to a wall face of a wall in which the opening is formed at the full-open position, wherein the operating mechanism has a driving base mounted on a piston rod of the air cylinder, a lever member mounted on the valve shaft, a connecting mechanism for connecting the lever member and the driving base to each other capable of relative displacement, a cam mechanism for tilting the lever member, and a stopper mechanism for stopping the lever member at the opposing position of the valve plate or the full-open position;

the cam mechanism is formed by a cam groove formed in the driving base and a cam follower mounted on the lever member, and the cam follower can move in the cam groove from an intermediate engagement position to be engaged with the center in the cam groove to a first engagement position at one end of the cam groove or a second engagement position at the other end by relative displacement between the driving base and the lever member, and the lever member, the valve shaft, and the valve plate are integrally tilted by the movement;

the connecting mechanism has a connecting table, a lever spring interposed between the connecting table and the lever member, and a guide spring interposed between the connecting table and the driving base, and when the cam follower is at the intermediate engagement position, the driving base and the lever member are brought into an integral state, while when the cam follower is moving in the cam groove from the intermediate engagement position to the first engagement position or the second engagement position, the driving base and the lever member are relatively displaced by deformation of the lever spring or the guide spring so that the lever member can be tilted; and the stopper mechanism has a first contact member and a second contact member provided on the lever member and a first stopper and a second stopper in a fixed relationship with the air cylinder, and the stopper mechanism is configured such that the lever member is stopped at the opposing position by contact between one of the contact members and one of the stoppers, while the lever member is stopped at the full-open position by contact between the other contact member and the other stopper.

2. The gate valve according to claim 1, wherein
a table receiver and a base-spring receiver are formed on the driving base at an interval in a moving direction of the driving base; and
a lever-spring receiver is formed on the lever member so as to occupy a position opposite the table receiver through the base-spring receiver, the connecting table is disposed between the table receiver and the base-spring receiver capable of displacement, the lever spring is interposed between the connecting table and the lever-spring receiver, and the guide spring is interposed between the connecting table and the base-spring receiver.

3. The gate valve according to claim 2, wherein
two parallel guide shafts are mounted on the table receiver and the base-spring receiver for guiding the connecting table so as to penetrate the connecting table, and two pieces of the coil-shaped guide springs are provided so as to surround each of the guide shafts.

4. The gate valve according to claim 1, wherein
when the cam follower moves in the cam groove from the intermediate engagement position to the first engagement position, the connecting table is locked by the driving base and the lever spring is deformed, while when the cam follower moves in the cam groove from the intermediate engagement position to the second engagement position, the connecting table is locked by the lever member and the guide spring is deformed.

5. The gate valve according to claim 2, wherein
when the cam follower moves in the cam groove from the intermediate engagement position to the first engagement position, the connecting table is locked by the driving base and the lever spring is deformed, while when the cam follower moves in the cam groove from the intermediate engagement position to the second engagement position, the connecting table is locked by the lever member and the guide spring is deformed.

6. The gate valve according to claim 3, wherein
when the cam follower moves in the cam groove from the intermediate engagement position to the first engagement position, the connecting table is locked by the driving base and the lever spring is deformed, while when the cam follower moves in the cam groove from the intermediate engagement position to the second engagement position, the connecting table is locked by the lever member and the guide spring is deformed.

7. The gate valve according to claim 1, wherein
two valve shafts connected to both ends of the valve plate and two pairs of operating mechanisms corresponding to each of the valve shafts are symmetrically disposed through the air cylinder on both right and left sides of the air cylinder.

8. The gate valve according to claim 2, wherein
two valve shafts connected to both ends of the valve plate and two pairs of operating mechanisms corresponding to each of the valve shafts are symmetrically disposed through the air cylinder on both right and left sides of the air cylinder.

9. The gate valve according to claim 3, wherein
two valve shafts connected to both ends of the valve plate and two pairs of operating mechanisms corresponding to each of the valve shafts are symmetrically disposed through the air cylinder on both right and left sides of the air cylinder.

10. The gate valve according to claim 4, wherein
two valve shafts connected to both ends of the valve plate and two pairs of operating mechanisms corresponding to each of the valve shafts are symmetrically disposed through the air cylinder on both right and left sides of the air cylinder.

11. The gate valve according to claim 5, wherein
two valve shafts connected to both ends of the valve plate and two pairs of operating mechanisms corresponding to each of the valve shafts are symmetrically disposed through the air cylinder on both right and left sides of the air cylinder.

12. The gate valve according to claim 6, wherein
two valve shafts connected to both ends of the valve plate and two pairs of operating mechanisms corresponding to each of the valve shafts are symmetrically disposed through the air cylinder on both right and left sides of the air cylinder.

* * * * *